United States Patent [19]

Catalano et al.

[11] 4,443,653
[45] * Apr. 17, 1984

[54] THIN FILM PHOTOVOLTAIC DEVICE WITH MULTILAYER SUBSTRATE

[75] Inventors: Anthony W. Catalano, Rushland, Pa.; Manjul Bhushan, Wilmington, Del.

[73] Assignee: The University of Delaware, Newark, Del.

[*] Notice: The portion of the term of this patent subsequent to Aug. 3, 1999 has been disclaimed.

[21] Appl. No.: 351,472

[22] Filed: Feb. 23, 1982

Related U.S. Application Data

[63] Continuation-in-part of Ser. No. 200,447, Oct. 24, 1980, Pat. No. 4,342,879.

[51] Int. Cl.$^3$ .................... H01L 31/06; H01L 31/18
[52] U.S. Cl. .................... 136/265; 136/256; 136/258; 136/260; 357/30; 357/71; 29/572; 427/74; 427/87; 427/89
[58] Field of Search ............. 136/256, 258 PC, 260, 136/261, 265; 357/30, 71; 427/74, 86, 87, 89; 29/572

[56] References Cited

U.S. PATENT DOCUMENTS 4,113,532  9/1978  Authier et al. ............... 148/174
4,313,254  2/1982  Feldman et al. ............... 29/572
4,342,879  8/1982  Catalano et al. ............... 136/265

FOREIGN PATENT DOCUMENTS 2386359  12/1978  France .................. 136/258 PC

OTHER PUBLICATIONS

J. J. Cuomo et al., "Fabrication of Large Grain Columnar Polycrystalline Thin Films", *IBM Technical Disclosure Bulletin*, vol. 18, pp. 3063-3064 (1976).

A. Catalano et al., "Thin Polycrystalline $Zn_3P_2$ Films for Photovoltaic Cells", *Conf. Record, 14th IEEE Photovoltaic Specialists Conf.* (1980), pp. 641-646.

M. Bhushan, "Schottky Solar Cells on Thin Polycrystalline $Zn_3P_2$ Films," *Appl. Phys. Lett.*, vol. 40, pp. 51-53 (Jan. 1982).

S. Minagawa et al.; "Fabrication & Characterization of Solar Cells using Dendritic Silicon Thin Films Grown on Alumina Ceramic," *Conf. Record, 12th IEEE Photovoltaic Specialists Conf.* (1976), pp. 77-81.

*Primary Examiner*—Aaron Weisstuch
*Attorney, Agent, or Firm*—Connolly & Hutz

[57] ABSTRACT

A thin film photovoltaic device which utilizes at least one compound semiconductor layer chosen from Groups IIB and VA of the Periodic Table is formed on a multilayer substrate The substrate includes a lowermost support layer on which all of the other layers of the device are formed. Additionally, an uppermost carbide or silicon layer is adjacent to the semiconductor layer. Below the carbide or silicon layer is a metal layer of high conductivity and expansion coefficient equal to or slightly greater than that of the semiconductor layer.

26 Claims, 3 Drawing Figures

THIN FILM PHOTOVOLTAIC DEVICE WITH MULTILAYER SUBSTRATE

GOVERNMENT RIGHTS

The Government has certain rights in this invention pursuant to Subcontract No. XR-9-8062-1 awarded by the Solar Energy Research Institute under U.S. Department of Energy Contract No. EG-77-C-01-4042.

CROSS REFERENCE TO RELATED APPLICATION

This application is a continuation-in-part of U.S. patent application Ser. No. 200,447, filed Oct. 24, 1980, now U.S. Pat. No. 4,342,879, the details of which are incorporated herein by reference thereto.

BACKGROUND OF INVENTION

This invention is particularly directed to improvements in photovoltaic devices and the like and particularly such devices which include at least one semiconductor layer which is a thin polycrystalline film of suitable large grain size. One such semiconductor material is zinc phosphide ($Zn_3P_2$).

Zinc phosphide is an important semiconductor for photovoltaic solar cells. See, for example, a report by applicant et al, which was published in the *Proceedings of the Fourteenth IEEE Photovoltaic Specialists Conference*, pp. 641–646 (1980) and references cited therein. It possesses a steep optical absorption edge near 1.5 eV, where the maximum performance of terrestrially based cells is expected, has a sufficiently long ($\sim 10$ $\mu m$) minority carrier diffusion length to permit high current collection efficiency, and is comprised of elements which are abundant, thus permitting widespread use. To date, conversion efficiencies as high as 6.08% (total area, 100 mW/$cm^2$ ELH simulation) have been reported for metal-semiconductor junctions. Cells of the heterojunction type and cells comprising solid solutions of zinc phosphide and cadmium phosphide are described in commonly assigned U.S. patent application Ser. No. 944,971, the details of which are incorporated herein by reference thereto. Cells of the homojunction type are described in said U.S. Pat. No. 4,342,879.

A particular problem with such semiconductor materials as zinc phosphide is in the difficulties encountered for selecting a proper substrate which meets the necessary criteria while being compatible with high temperature growth. For example, the relatively high coefficient of thermal expansion of zinc phosphide ($1.4 \times 10^{-5}/°C$), compared to those of other semiconducting materials, such as silicon, which have a coefficient of thermal expansion of $4.5 \times 10^{-6}/°C$, makes it difficult to bond zinc phosphide to conventional substrate materials as are commonly used in making thin film photovoltaic cells. This problem is particularly apparent in view of the temperatures to which these materials are exposed in the normally employed close spaced vapor transport (CSVT) method of forming zinc phosphide films.

Commonly assigned application Ser. No. 944,971 teaches a mica substrate with a layer of silver covered by a thin diffusion barrier of carbon as a substrate for forming zinc phosphide semiconductor layers of Schottky barrier and heterojunction type photovoltaic cells. The parent application teaches, inter alia, homojunction photovoltaic cells comprising zinc phosphide deposited on a multilayer substrate. Pasierb in U.S. Pat. No. 3,368,125 teaches use of a thin germanium layer in combination with a tin layer on a molybdenum substrate for depositing gallium arsenide films. The teaching of Pasierb has not been, to our knowledge, applied to semiconductor materials from Groups IIB and VA of the Periodic Table such as zinc phosphide. Furthermore, even if the teaching of Pasierb were operable with zinc phosphide and the like, the high cost of germanium and molybdenum would mitigate against their use in photovoltaic devices for large scale generation of electricity. A publication by Sberveglieri et al which appears in *Thin Solid Films*, Vol. 83, pp.L133–L136 (1981) teaches use of an evaporated layer of thallium in connection with a polished stainless steel substrate for deposition of zinc phosphide thin films. The teaching of Sberveglieri et al involves annealing for periods of up to eight hours. In view of the expense and toxicity of thallium and the long processing times inherent in this method, such substrates are unlikely to be useful for commercialization of zinc phosphide comprising thin film photovoltaic cells.

Photovoltaic cell devices as taught in the prior art can suffer from low yield and loss in conversion efficiency due to low fill factor. These problems are attributable to properties of the substrate such as high contact resistance, unwanted doping, incidence of pin holes, loss of adherence, extreme roughness and small grain size. Thus it would be advantageous to provide a substrate which overcomes these problems.

SUMMARY OF INVENTION

The object of this invention is to provide a substrate for depositing thin films of zinc phosphide that are stable, smooth, essentially free of pin holes, having grain size 1 to 10 microns, and as thin as 2 to 4 $\mu m$.

A further object of this invention is a multilayer substrate wherein one of the layers of the substrate acts as a support for the remaining layers of the device and has an expansion coefficient equal to or slightly larger than the expansion coefficient of the semiconductor layer. The substrate layers may also include a metal layer of low resistivity and high conductivity and also includes a layer adjacent to the semiconductor layer which functions as both barrier and as means for adhering to its adjacent substrate layer. A thin layer of carbon or silicon is provided to form the adherent means and barrier layer.

A still further object of this invention is an improved zinc phosphide comprising photovoltaic cell device wherein the multilayer substrate serves as an opaque first electrical contact wherein the series resistance is minimized so as to increase fill factor and conversion efficiency of the photovoltaic cell.

THE DRAWINGS

DETAILED DESCRIPTION

Figure 1:
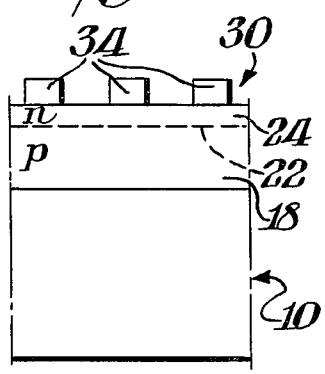
FIG. 1 is a cross-sectional view in elevation (with the cross hatching omitted for clarity) of a thin film photovoltaic solar cell in accordance with this invention.
Figure 2:
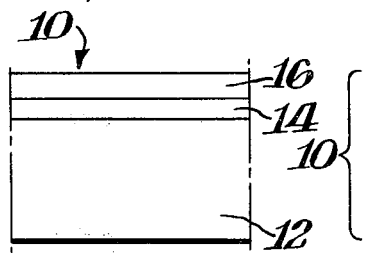
FIG. 2 is a cross-sectional view in elevation (with the cross hatching omitted for clarity) showing a substrate in accordance with this invention.
Figure 3:
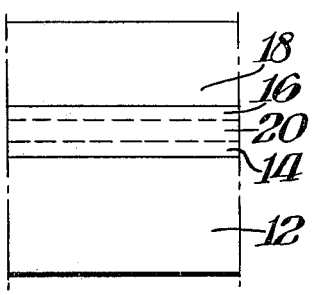
FIG. 3 is a cross-sectional view similar to FIG. 1 showing the substrate of FIG. 2 with the semiconductor layer grown thereon.

This invention is related to an improved thin film photovoltaic solar cell which includes an opaque contact, a transparent contact and at least one semiconductor layer formed therebetween. The semiconductor layer consists of a p-type region and an n-type region forming a homojunction, or a p-type semiconductor layer and an n-type semiconductor layer forming a heterojunction. A p-type semiconductor layer and a metal forming a Schottky barrier may also be used. Such semiconductor material is from the class of isostructural compounds comprised of elements from Groups IIB and VA of the Periodic Table, for example, zinc phosphide ($Zn_3P_2$), zinc arsenide ($Zn_3As_2$), cadmium phosphide ($Cd_3P_2$), cadmium arsenide ($Cd_3As_2$) and alloys thereof. Such semiconductor layers are formed by high temperature vapor deposition methods. This invention relates to a suitable substrate and techniques for the fabrication of such thin film photovoltaic solar cells. FIG. 1 relates to the photovoltaic solar cell. FIGS. 2–3 relate to the substrate.

FIG. 1 relates to the particularly advantageous aspect of the invention, which is a homojunction photovoltaic cell 30 using a semiconductor of a material such as zinc phosphide.

P-type semiconductor layer 18 is formed on substrate 10. Layer 24 is the n-type region which in contact with layer 18 forms photovoltaic homojunction 22. Transparent contact 34 is a metallization pattern in the form of a grid or series of parallel stripes.

Referring to FIG. 1, substrate 10 may be an iron-silicon alloy sheet containing approximately three percent silicon. Alternatively, the substrate may be a multilayer structure which is described in greater detail hereinafter with respect to FIGS. 2 and 3. Layer 18 is a polycrystalline p-type $Zn_3P_2$, 2–500 μm thick, preferably less than 10 μm thick. Layer 18 has a resistivity 1–100 $10^6$ -cm, preferably 20 $10^6$ -cm. Layer 24 is polycrystalline n-type $Zn_3P_2$, 0.1–1 μm thick, preferably 0.5 μm, and forming with layer 18 photovoltaic junction 22.

Transparent contact 34 is formed from metals such as aluminum, cadmium, magnesium, nickel, titanium or zinc. Preferably, the metal is aluminum or magnesium. The dimensions, i.e., width, height and spacing, of the grid may be determined to best advantage by applying the design criteria set forth by N. C. Wyeth in *Solid State Electronics*, Vol. 20, p. 629 [1977].

Alternatively, n-type region 24 may be an n-type semiconductor layer of a material other than zinc phosphide so that photovoltaic junction 22 is characterized as a heterojunction. The invention also relates to photovoltaic devices of the Schottky barrier type wherein semiconductor region or layer 24 is replaced by a thin metal film comprising, for example, aluminum or magnesium. As described in application Ser. No. 944,971, layer or region 24 may be omitted entirely, the Schottky barrier being formed between transparent contact grids 34 and semiconductor 18.

Further examples of photovoltaic devices which may be made in accordance with this invention can be found in U.S. Pat. No. 4,342,879.

The formation of semiconductor layers in accordance with this invention is carried out by growth from the vapor onto a heated substrate. In general, the growth of thin polycrystalline films of a suitable large grain size requires high temperatures to provide the necessary surface atom mobility. The substrate must provide a surface which is conducive to nucleation and growth of layers which are smooth and essentially pin hole free without having to make the semiconductor layers unnecessarily thick. Unfortunately, if thin films are to be prepared by vapor transport, the components of the vapor may react with the substrate, giving rise to unwanted compounds, doping, etc. For example, formation of certain compounds which are insulating in their electrical characteristics causes series resistance losses. Diffusion of substrate material into the semiconductor layer can dope the semiconductor so as to reduce efficiency. Some of the criteria which a substrate must meet for high temperature growth are: it must have a thermal coefficient of expansion close to that of the semiconductor[s] to be deposited; it must be non-reactive; it must not dope the semiconductor; it must be adherent; it must make low resistance ohmic contact to the semiconductor; it must have a low sheet resistance; and it must allow suitable nucleation and growth of a thin film which is essentially smooth and pin hole free. Unfortunately, the above criteria are seldom met by a single substance.

$Zn_3P_2$ has a high ($\sim 14 \times 10^{-6\circ}$ C.$^{-1}$) thermal expansion coefficient which makes substrates of most refractory metals and semiconductors with low ($<6 \cdot 10^{-6\circ}$ C.$^{-1}$) expansion coefficient unsuitable for high temperature film growth. The thermal expansion coefficients of many of the more common metals (Al, Cu, Fe) are comparable to $Zn_3P_2$ and would prove to be ideal substrates, provided their reaction with phosphorous vapors and diffusion into the semiconductor could be prevented.

The aspect of the invention of FIGS. 2–3 thus relates to providing a suitable back contact which would meet the following requirements: (1) make ohmic contact to $Zn_3P_2$, (2) be unreactive in Zn and $P_4$ vapor at the 500–600° C. deposition temperature, (3) be mechanically stable, and (4) be resistant to interdiffusion. Carbon meets the first two requirements and uniform films with 5–10 μm grain size have been grown on carbon substrates. However, the low expansion coefficient ($10 \times 10^{-6\circ}$ C.$^{-1}$) of isotropic graphite compared to $Zn_3P_2$ results in cracking of the film during cooling. Thin films of carbon have been deposited on mica by arc and electron beam evaporation, but above $\sim 0.1$ μm thickness, the high intrinsic stress makes the film mechanically unstable. Below 0.1 μm, films are frequently stable, but the sheet resistance is too high to yield workable devices.

This invention also relates to a new multilayer substrate which overcomes the problems attendant with the use of carbon, while benefitting from its advantages.

Conceptually, the ideal substrate for the deposition of a reactive compound or elemental semiconductor may be viewed as a multilayer structure consisting of: a thick, mechanically rigid, bottom layer which matches the expansion coefficient of the semiconductor; a conducting metal film to give a low series resistance contact; and an interlayer to provide adherence, prevent reaction between the semiconductor and the underlying components, and ohmic contact to the semiconductor.

FIG. 2 illustrates a substrate 10 in accordance with this invention which is of the multilayer type specifically designed to meet the above criteria. Substrate 10 includes a support layer 12 which is preferably made of mica or iron-silicon alloy sheet, although other materials such as glass, magnesium oxide, iron, stainless steel, copper, or aluminum may be used. Substrate 10 also includes a layer 14 which is selected for its conductivity characteristics. In a form of this invention, layer 14 is made from iron which is deposited on support 12 by vacuum evaporation such as thermal evaporation or electron beam evaporation. If desired, the iron may be used to replace the mica and layers 12 and 14 may thereby be a single layer. Where separate layers are used, the layer 14 preferably has a thickness of at least 500 Å to 1 mm, although the layer should not be too thick. Substrate 10 also includes a layer 16 which functions as a diffusion barrier and adherent means as later described. Layer 16 is made by depositing carbon on layer 14 by any suitable means such as electron beam or arc vaporization in a vacuum or plasma decomposition of hydrocarbon. The thickness of the carbon layer may be 500–1000 Å. When the carbon layers are too thick, high intrinsic stress of carbon film causes microcracks to develop which allow iron to diffuse into $Zn_3P_2$. It was also found that prompt deposition of carbon on the iron films is advantageous. All of the layers in substrate 10 are preferably formed or deposited at room temperature. Layer 16 is preferably of a thickness of 500–2000 Å, with 1000 Å being preferred. Support layer 12 is much thicker than layers 14 and 16, and may be as great as 500 μm.

Ordinarily, simply depositing a carbon layer on iron would not be sufficient to cause the carbon to remain secured to the iron. The present invention, however, includes the recognition that the substrate is used in connection with a semiconductor which is grown or deposited at very high temperatures. As previously discussed, the preferred semiconductor is zinc phosphide, but other semiconductors such as gallium arsenide, indium phosphide or silicon may also be used. FIG. 3 illustrates the formation of the semiconductor layer 18 which is grown at high temperatures in order to obtain the desired structure or preferred grain size of, for example, the zinc phosphide film. Under these high temperature conditions, a carbon-iron reaction takes place, thereby resulting in an intermediate region 20 of iron carbide which is believed to be produced. This intermediate region functions to effectively adhere carbon layer 16 to iron layer 14. The resultant substrate 10 thus provides a non-reactive or inert ohmic contact which withstands the high temperature necessary for semiconductor film growth and the substrate is mechanically stable to function as a support while having all of the characteristics necessary for ohmic contact.

If desired, the substrate 10 including the iron carbide region 20 may be formed by applying a separate high temperature heating to the substrate before the semiconductor is grown thereon rather than utilizing the high temperature from the semiconductor growing step. Such preliminary high temperature heating would be done in an inert or non-oxidizing atmosphere.

In an example of the practice of this aspect of the invention, multiple layer, thin film substrates have been prepared consisting of a thin film of arc or electron beam deposited carbon 200–1000 Å thick deposited onto a film of either iron or silver of the same thickness. The iron or silver film, in turn, was previously deposited on mica, which has the same expansion coefficient as $Zn_3P_2$ and provides the mechanical support.

Films of $Zn_3P_2$ with grain size 3–10 μm thick have been grown on such substrates by close-spaced-transport. At a substrate temperature of 575° C. a reaction between carbon and iron films occured within the time scale of the film growth, i.e., 10 minutes.

Various materials may be used for practicing the concepts of this invention. Layer 16 is selected of a material which acts as a barrier in that it prevents a chemical reaction between the semiconductor 18 and the high conductivity layer 14. Layer 16, as previously noted, has the added function of comprising adherent means by reacting under high temperature with layer 14. Layer 14 is selected for having low resistivity and high conductivity and metals such as iron or silver may be used. Layer 14 also makes intimate contact with support layer 12 which in turn is selected to provide stability to the substrate and acts as the thermal expansion match component of the substrate 10 by having the same or slightly greater expansion coefficient as that of semiconductor 18. Support layer 12 may be a metal, may be a semiconductor or may be an insulator.

In a preferred embodiment of this invention, layer 16 is made by depositing silicon by electron beam evaporation. Thus, when support layer 12 is, for example, muscovite mica and layer 14 is iron, layer 16 is a thin layer of silicon not more than 150 Å thick and preferably 100 Å thick. An evaporatively deposited 500–1000 Å thick iron layer 14 may be deposited on muscovite mica and used in connection with silicon for layer 16. If desired, layers 12 and 14 are combined into a single layer. Iron, copper or aluminum may be used. Type 301 stainless steel and silicon steel containing 3% (AISI Type Nos. M-6 or M-22) have been found to be particularly useful in this regard. When stainless steel and silicon steel are used to form the combined support and conductivity layers, silicon interlayer 16 can be a few thousand Å thick and is preferably 1000 Å thick. Zinc phosphide thin films and devices have been successfully prepared on stainless steel and silicon steel in accordance with this aspect of the invention. For the operative examples, the stainless steel was Type 301 shim, 0.010 gage, obtained from Precision Brand Products, Inc., Downers Grove, Ill. as product No. 698158. The silicon steel was type M-22, obtained from National Materials Corporation, New Kingston, Pa. The steels should be mechanically polished and rinsed with acetone prior to deposition of the carbon or silicon layers in accordance with the teachings of this invention.

An operative example of the practice of this invention follows. In the first step the mica, 0.005 to 0.01 millimeter thick, was freshly cleaved or, as is preferred, cleaned before use by immersion for 10 minutes in 10% v/v HF, followed by rinsing in de-ionized water and drying. The cleaned mica was then mounted in a Varian model 3118 bell jar vacuum evaporator with a six-inch high speed pumping stack. The vacuum evaporator system comprises an AIRCO-TEMESCAL Model STIH 270-1 multi-hearth turreted electron beam evaporation source which is connected to a Model CV-8 power supply of the same manufacture. Iron for coating the mica was obtained from Materials Research Corporation and was nominally 99.5% pure. The iron was machined to fit the size of the hopper in the aforementioned turreted electron beam evaporation source. Similarly, semiconductor grade polycrystalline silicon was placed in a second hopper of the electron beam source. In these experiments, the silicon was obtained as an n-type polycrystalline boule under the designation K-4695 from Electronic Space Products, Inc. of Los Angeles, Calif. Suitably sized pieces were cut from the boule with a diamond saw. The vacuum chamber was then evacuated to a pressure of about $10^{-7}$ Torr. Iron was first evaporatively deposited on the mica to a thickness of about 1000 Å at a rate of 8 to 10 Å/sec. Immediately thereafter, the silicon was evaporated at a rate of greater than 10 Å/sec for about 10 sec while a shutter covered the iron coated mica. The silicon evaporation rate was reduced to 5 Å/sec and the shutter was opened. Silicon was allowed to deposit on the iron coated mica to a thickness of about 100 Å. The shutter was then re-positioned to cover the silicon-iron-mica structure and the electron beam turned off. After cooling for at least one hour under vacuum the substrate structure was removed.

A zinc phosphide layer was next deposited on the substrate prepared as above by the close spaced vapor transport (CSVT) method. The process was carried out in an argon atmosphere, the zinc phosphide source maintained at 675° C., the source to substrate distance 0.1 cm and the substrate temperature at least 550° C. and most likely 575° C. Under these conditions, four minutes of growth time produced a zinc phosphide film of 2-4 microns thickness.

Zinc phosphide films produced in this manner were examined in the scanning electron microscope and found to be exceptionally smooth and essentially free of pin holes. Measurement of grain size with a scanning electron microscope revealed grain diameters of 1-10 microns with larger grains predominating. Thin material film Schottky barrier photovoltaic cells were fabricated using zinc phosphide on silicon-iron-mica substrates. Magnesium was used as a Schottky barrier metal and the cell was assembled in the manner set forth in our publication which appeared in the *Proceedings of the 15th IEEE Photovoltaic Specialists Conference*, pp. 1261-1264 (1981). Analysis of these cells by known means, such as current-voltage behavior under illumination of simulated sunlight, capacitance-voltage behavior and spectral response revealed that photovoltaic cells formed on the inventive silicon-iron-mica substrates were characterized by consistently larger minority carrier diffusion length in the range of 1-3 micron, improved diode characteristics and reduced series resistance. These improvements in critical device parameters have resulted in improved short circuit current, open circuit voltage, fill factor, and efficiency, compared to thin film zinc phosphide cells known heretofore. Furthermore, the thinner zinc phosphide and shorter film deposition times inherent in this embodiment of the invention lower the raw material and processing costs associated with manufacturing zinc phosphide comprising photovoltaic devices.

It is anticipated that the teachings hereof will lead to similar improvements in the performance of heterojunction and homojunction photovoltaic cells comprising zinc phosphide and related semiconductor materials.

Although the invention is illustrated using zinc phosphide as the principal semiconductor, it is understood that semiconductors taken from Groups IIB and VA of the Periodic Table such as zinc arsenide, cadmium phosphide, cadmium arsenide and alloys thereof can be employed in place of, or in combination with, zinc phosphide without departing from the teachings of the invention.

What is claimed is:

1. In a thin film photovoltaic device having an ohmic back contact and a transparent electrical contact with at least one semiconductor layer therebetween of a material of the type formed by high temperature growth, the improvement being said ohmic back contact comprises a multilayer substrate capable of withstanding the high temperature for forming said semiconductor layer, said semiconductor layer which is adjacent said substrate being made of a material from the class of isostructural compounds comprised of elements selected from Groups IIB and VA of the Periodic Table, said substrate layers including (a) a lowermost support layer remote from said semiconductor layer on which all of the other layers of said device are formed, (b) an uppermost carbon diffusion barrier layer adjacent said semiconductor layer, (c) a metal layer of high conductivity below said diffusion barrier layer and having an expansion coefficient equal to or slightly greater than the expansion coefficient of said semiconductor layer, and (d) an intermediate metal carbide layer between said diffusion barrier layer and said metal layer.

2. In the device of claim 1 wherein the multilayer substrate includes at least three separate layers.

3. In the device of claim 1 wherein said support layer and said metal layer comprise the same layer.

4. In the device of claim 1 wherein said semiconductor is zinc phosphide.

5. In the device of claim 4 wherein said zinc phosphide layer is from two to four microns thick.

6. In the device of claim 1 wherein said metal layer is iron.

7. In the device of claim 1 wherein said metal layer is iron, and said support layer is mica.

8. In a thin film photovoltaic device having an ohmic back contact and a transparent electrical contact with at least one semiconductor layer therebetween of a material of the type formed by high temperature growth, the improvement being said ohmic back contact comprises a multilayer substrate capable of withstanding the high temperature for forming said semiconductor layer, said semiconductor layer which is adjacent said substrate being made of a material from the class of isostructural compounds comprised of elements selected from Groups IIB and VA of the Periodic Table, said substrate layers including (a) a lowermost support layer remote from said semiconductor layer on which all of the other layers of said device are formed, (b) an uppermost silicon diffusion barrier layer adjacent said semiconductor layer, (c) a metal layer of high conductivity being below said silicon layer and having an expansion coefficient equal to or slightly greater than the expansion coefficient of said semiconductor layer, and (d) means for causing said silicon layer to adhere to said metal layer.

9. In the device of claim 8 wherein the multilayer substrate includes at least three separate layers.

10. In the device of claim 8 wherein said support layer and said metal layer comprise the same layer.

11. In the device of claim 8 wherein said semiconductor is zinc phosphide.

12. In the device of claim 11 wherein said zinc phosphide layer is from two to four microns thick.

13. In the device of claim 8 wherein said metal layer is iron, and said support layer is mica.

14. In the method of making a thin film photovoltaic device having an ohmic back contact and a transparent electrical contact, with at least one semiconductor layer therebetween of a material which is formed in the device by high temperature growth, the improvement comprising forming the ohmic back contact as a multilayer substrate capable of withstanding said high temperature for forming the semiconductor layer, the semiconductor layer being made of a material from the class of isostructural compounds comprised of elements selected from Groups IIB and VA of the Periodic Table, the steps for forming the multilayer substrate including providing a lowermost support layer for supporting all of the other layers of the device, forming on the support layer a metal layer having high conductivity and having an expansion coefficient equal to or slightly greater than that of the semiconductor layer, forming on the metal layer a carbon diffusion barrier layer, forming an intermediate metal carbide layer between the barrier layer and the metal layer, and forming the semiconductor layer on the barrier layer.

15. In the method of claim 14 wherein the support, metal and barrier layers are formed at low temperature, and the metal carbide intermediate layer between the barrier and metal layers is formed at high temperature from reaction of the barrier and metal layers.

16. In the method of claim 15 wherein the intermediate layer is formed by a high temperature heating step independent of the semiconductor growing step.

17. In the method of claim 15 wherein the intermediate layer results from the high temperature heating of the semiconductor growing step.

18. In the method of claim 14 wherein the semiconductor is zinc phosphide and the metal layer is iron.

19. In the method of claim 18 wherein the zinc phosphide layer is grown to a thickness of two to four microns.

20. In the method of making a thin film photovoltaic device having an ohmic back contact and a transparent electrical contact, with at least one semiconductor layer therebetween of a material which is formed in the device by high temperature growth, the improvement comprising forming the ohmic back contact as a multilayer substrate capable of withstanding said high temperature for forming the semiconductor layer, the semiconductor layer being made of a material from the class of isostructural compounds comprised of elements selected from Groups IIB and VA of the Periodic Table, the steps for forming the multilayer substrate including providing a lowermost support layer for supporting all of the other layers of the device, forming a metal layer having high conductivity and having an expansion coefficient equal to or slightly greater than that of the semiconductor layer, forming on the metal layer a silicon diffusion barrier layer adjacent the semiconductor layer providing means for causing the silicon diffusion barrier and metal layers to adhere to each other, and forming the semiconductor layer on the barrier layer.

21. In the method of claim 20 wherein the support layer and the metal layer are formed as separate layers.

22. In the method of claim 20 wherein the support layer and the metal layer are formed from the same layer.

23. In the method of claim 20 wherein the semiconductor is zinc phosphide and the metal layer is iron.

24. In the method of claim 23 wherein the zinc phosphide layer is grown to a thickness of two to four microns.

25. In the method of claim 20 wherein the support layer is mica and the metal layer is iron.

26. In the method of claim 20 wherein the silicon barrier layer is formed by electron beam evaporation.

* * * * *